(12) United States Patent
Kutchinsky et al.

(10) Patent No.: US 12,732,162 B2
(45) Date of Patent: Sep. 8, 2026

(54) METHOD OF PRECHARGING A SWITCHABLE FILTER

(71) Applicant: QM Technologies ApS, Ballerup (DK)

(72) Inventors: Jonatan Kutchinsky, Copenhagen (DK); Hans Sebastian Preus Kristoffersen, Copenhagen (DK)

(73) Assignee: QM Technologies ApS, Ballerup (DK)

( * ) Notice: Subject to any disclaimer, the term of this patent is extended or adjusted under 35 U.S.C. 154(b) by 148 days.

(21) Appl. No.: 18/567,270

(22) PCT Filed: Jun. 8, 2022

(86) PCT No.: PCT/EP2022/065500
§ 371 (c)(1),
(2) Date: Dec. 5, 2023

(87) PCT Pub. No.: WO2022/258665
PCT Pub. Date: Dec. 15, 2022

(65) Prior Publication Data

US 2024/0275364 A1 Aug. 15, 2024

(30) Foreign Application Priority Data

Jun. 8, 2021 (EP) .................................... 21178221

(51) Int. Cl.
*H03H 11/04* (2006.01)
*G01R 31/317* (2006.01)
*H03F 3/00* (2006.01)

(52) U.S. Cl.
CPC ....... *H03H 11/04* (2013.01); *G01R 31/31702* (2013.01); *H03F 3/005* (2013.01)

(58) Field of Classification Search
None
See application file for complete search history.

(56) References Cited

U.S. PATENT DOCUMENTS 4,752,749 A 6/1988 Moger
5,739,720 A * 4/1998 Lee .................... H03F 3/45968 330/9

(Continued)

FOREIGN PATENT DOCUMENTS

EP 2169828 A1 3/2010

OTHER PUBLICATIONS

Extended European Search Report from corresponding EP Application No. 21178221.4, Oct. 26, 2021.

(Continued)

*Primary Examiner* — Jermele M Hollington
(74) *Attorney, Agent, or Firm* — Workman Nydegger

(57) ABSTRACT

A switchable capacitor assembly is provided that includes a first terminal, a second terminal, a first resistor, a first switch, a capacitor operatively connected between the first switch and the second terminal, a voltage follower operatively connected between the first terminal and the first resistor, the first resistor being operatively connected between the voltage follower and the first switch, and a second switch configured to short circuit the first resistor. The first switch is configured to toggle between two states including a first state where the switch operatively connects the capacitor to the first resistor and a second state where the switch operatively connects the capacitor to the first terminal.

9 Claims, 1 Drawing Sheet

(56) References Cited

U.S. PATENT DOCUMENTS

| | | | | |
|---|---|---|---|---|
| 6,784,728 | B2 | 8/2004 | Fischer | |
| 7,224,218 | B1 | 5/2007 | Jiang et al. | |
| 9,455,671 | B2 * | 9/2016 | Kropfitsch | H03F 1/086 |
| 2006/0022726 | A1 | 2/2006 | Maeda | |
| 2014/0070976 | A1 * | 3/2014 | Hurrell | G11C 27/02<br>341/172 |
| 2021/0159866 | A1 * | 5/2021 | Yabe | H03F 3/005 |

OTHER PUBLICATIONS

International Search Report from corresponding PCT Application No. PCT/EP2022/065500, Sep. 14, 2022.

* cited by examiner

METHOD OF PRECHARGING A SWITCHABLE FILTER

BACKGROUND

The invention relates to a switchable filter and in particular a filter which may be coupled into a signal path without generating detrimental transients.

Technology of this type may be seen in U.S. Pat. No. 6,784,728 also describing a switchable low frequency filter. Further technology may be seen in EP2169828, U.S. Pat. No. 7,224,218, US2014/0709676 and US2006/022726.

SUMMARY

In a first aspect, the invention relates to a switchable capacitor assembly comprising:

- a first terminal,
- a second terminal,
- a first resistor,
- a first switch,
- a capacitor operatively connected between the first switch and the second terminal,
- a voltage follower operatively connected between the first terminal and the first resistor,
- the first resistor being operatively connected between the voltage follower and the first switch, where the first switch is configured to toggle between two states comprising:

- a first state where the switch operatively connects the capacitor to the first resistor and
- a second state where the switch operatively connects the capacitor to the first terminal.

In this context, a terminal may be any type of electrical or conductive connection or portion, such as a pad, connector or the like. A terminal may be configured to be permanently or detachably connected to by other electric or electronic components, such as signal sources, voltage sources, devices to be tested or the like.

A resistor may be provided in any desired manner. Often, resistors are electrical components individually selectable for their properties, such as resistance, heat generation, size and the like. Resistors may be separate elements/components or form part of a circuit, such as an integrated circuit, comprising also other components. The resistor may have two terminals of which one is operationally connected to the voltage follower and the other to the first switch.

A switch may be embodied in a number of manners. Transistors is a widely used type of switch, as is relays, such as latched relays. A switch often comprises two connections or terminals between which an electrical connection may be provided or not. Additional connections may be provided, and electrical connection between one or more pairs, for example, of such connections may be provided selectively by the switch. A switch may have two or more states between which it may toggle or alter. Two states may be "connection provided" and "connection not provided" between two connections. Two states may alternatively be "connection between A and B provided" and "connection provided between A and C". A switch often is controllable by an input signal which may cause the switch to assume a particular state or toggle between states.

A capacitor may be embodied in any desired manner, such as a separate electronic component. The capacitor may form part of an integrated circuit if desired. It is noted that many elements may have a capacitance, and that the invention is not limited to any particular type of capacitor. In this context, the capacitor preferably has two inputs or terminals, where one is operatively connected to the first switch. The other terminal of the capacitor may be operatively connected to the second terminal.

A voltage follower may be embodied in many manners. A presently preferred type of voltage follower comprises an amplifier. This has the advantage that the powering of the voltage follower may be separate from any signal received on the first terminal. The voltage follower may determine or detect the voltage on the first terminal and may output, on an output, a voltage corresponding more or less to that voltage. Preferably, the output voltage is identical to the voltage on an input of the voltage follower and/or on the first terminal, but usually, circuits are not perfect, and as the output is operationally connected to the first resistor and optionally also the capacitor, a voltage difference may exist. It is desired that this voltage difference is below a predetermined voltage, such as a threshold voltage of the amplifier.

The voltage follower may have an input operationally connected to the first terminal and an output operationally connected to the first resistor.

The output voltage of the voltage follower may follow that on the first terminal but may vary therefrom and may be delayed due to operation of the amplifier and the components connected thereto.

In general, an operational connection is a connection between the two components in question, either directly (galvanically) or via other components. Clearly, resistors, switches or other components may be added in order to optimize or adapt the operation of the assembly. For example, the first resistor may be formed by a number of elements, the combined resistance of each is as desired, and the same may be the situation for any switch, capacitor or the like.

The assembly further comprises a second switch configured to short circuit the first resistor. Short circuiting a resistor means providing an alternative electric path around the resistor, where the alternative electric path has a resistance lower than that of the first resistor. It may be desired that the alternative electric path is galvanic without any other components than the second switch and/or that the resistance of this path is as low as practically possible.

Thus, the effect of the resistance of the first resistor may be removed from the circuit. This may be desired, as is described below, when, and preferably before, the first switch is brought from the first to the second state.

The overall operation of the switchable capacitor assembly will be described further below.

A second aspect of the invention relates to a switchable filter comprising:

- a signal path having a signal input and a signal output,
- a second resistor operatively provided between the signal input and the signal output and
- a switchable capacitor assembly according to the first aspect of the invention, where the first terminal is connected to the signal path and where the second terminal is connected to a first predetermined potential.

Clearly, all features, embodiments and considerations of the first aspect are equally relevant for the second aspect and any subsequent aspects of the invention.

The resistor and the capacitor, when the first switch is in the second state, will act as a low pass filter. The operation of the first switch then is to couple this filter into or out of the signal path. Thus, the characteristics of the low pass filter may be adapted by selecting the second resistor and the capacitor suitably. Also, as the second resistor is provided in the signal path, the effect thereof on any signal carried from the signal input to the signal output may be taken into account.

A signal path may be any conductor, wire or the like, which is configured to carry a signal. The signal path extends between the signal input and the signal output. Clearly, the signal path may extend further than that, such as from a source of a signal and to a device to receive the signal (see further below).

The assembly may be a stand-alone product to be introduced into a signal path between a source and a device, if desired. Multiple such assemblies may be combined into one product, if the device is to receive multiple signals.

The signal path comprises a second resistor operatively connected or provided between the signal input and the signal output. As explained further above, additional components may be provided, if desired, and the second resistor may be made up by a number of components if desired. Alternatively, the second resistor may be galvanically connected to the signal input and the signal output.

A third aspect of the invention relates to an assembly for testing a device, the assembly comprises:

- one or more signal sources,
- one or more switchable filters according to the second aspect of the invention, and
- a monitoring device configured to monitor the operation of the device, where:
- the device has one or more inputs and an output,
- each switchable filter is operationally connected between a separate source and a separate input,
- the output is operationally connected to the monitoring device.

In this context, the test may comprise the sources feeding varying or different signals to the device via the switchable filters. The test may be to ascertain an operation of the device or a setting-up or tuning of the device where the operation of the device is monitored while different signals are fed to the device in order to ascertain which signals are desired fed to the device in order to obtain a predetermined or suitable operation of the device.

The device clearly may be any type of device, but is preferably a device which does not tolerate large transients.

In one situation, the device may be a semiconductor-based qubit system for use in a quantum computer. Such qubits may be based on electron spin in quantum dots where each quantum dot is tuned by one or more voltages and where a device or circuit may comprise many, such as 10 or more, quantum dots. Typical tuning applications for this use require tuning voltages with a precision of better than 10 μV and a noise level (RMS) lower than 10 μV and which are still optimized over a voltage interval of several Volt.

In another situation, the device may be an ion-trap based qubit system where multiple ions (single atoms or molecules) are kept levitating using a combination of lasers and electrostatic fields. The ions are confined and moved around in the circuit by modifying voltages on 10 or more electrodes that each apply an electrostatic field around the ions. The voltages applied here will often need a precision of better than 10 μV and a noise level (RMS) lower than 10 μV.

In yet another situation, the device may be a system of tuneable superconducting qubits (also called transmon qubits) where local magnetic fields are tuned using 10 or more micro-coils each applying a magnetic field depending on the current drawn in the coil. Typically, currents up to 10 milli-Amperes are drawn, with a precision of 20 nano-Amperes with a noise level (RMS) lower than 20 nano-Amperes. Currents can be provided by a voltage source by applying for example a 1 kilo-Ohm resistor in series with the device.

Clearly, the more voltages to vary during tuning, the more complex will the tuning process be. Generally, the time it takes to optimise the voltages will grow exponentially with the number of voltages that need to be adjusted. It has been preferred to vary such voltages slowly, with a time constant limited by the low pass filter provided between the source and the device, and the switching of low-pass filters has been avoided due to unacceptable transients when switching, that would disrupt the fine tuning. By introducing the use of the present switchable filters, much faster varying of the signals and thus a much faster testing or tuning of the device will be possible, as the capacitor is separated from the signal path by the voltage follower and the first resistor. The fast tuning speed is becoming critically important with an increased number of voltages needing tuning. A 100 qubit system as mentioned above would risk needing months of tuning time to be optimised.

A signal source may be any source of an electric signal, such as a voltage source. The voltage source may be configured to output a predetermined voltage and to vary the voltage. This voltage may be varied with rather high gradients in order to be able to sweep the voltage quickly.

The device may have any number of inputs, where each input is connected to a separate source via a separate switchable filter. Thus, the inputs of the device may be fed different, varying voltages while the first switches of all filters are in the first state. Thereafter, voltages may be predetermined for each input and these voltages applied to each input and kept constant, at least as constant as possible, whereafter the first switches of all filters are brought to the second state, so that the filters are activated for all inputs and/or all sources. The filters may now filter noise or the like stemming from the sources and may thus prevent such noise from reaching the device. The device may then be operated for any desired purpose, such as in relation to a quantum computer core.

The monitoring device may be any type of monitoring device. The device to be tested or tuned may have a desired output, where the monitoring device is capable of ascertaining that the desired output of the device is received or when the desired output of the device is received. The signal(s) fed to the device may be pre-defined and may follow a predetermined scheme, such as to test all or many combinations thereof. Otherwise, it may be desired to correlate the output of the device to a controlling of the signal source(s) so as to arrive swifter at the desired output of the device. Device testing and tuning is a well-known discipline. The monitoring device thus may not only analyze the output of the device but also control the signal source(s) and/or determine when the output of the device is optimal or sufficient.

A fourth aspect relates to a method of switching the switching capacitor assembly of the first aspect, the method comprising the steps of:

a) connecting the second terminal to a first predetermined potential, b) providing a second predetermined voltage to the first terminal while the second switch does not short circuit the first resistor, c) operating, after step b), the second switch to short circuit the first resistor and d) operating the first switch from the first state to the second state.

The first predetermined potential or voltage may be any desired voltage, such as ground.

The second predetermined voltage may be a voltage desired provided to another device or circuit.

Preferably, the first and second potentials or voltages are DC voltages, but variations may occur, such as variations to be removed or reduced by operation of the capacitor.

Providing the first and second voltages on the first and second terminals causes these voltages to be provided over the capacitor, when the first switch is operated from the first state to the second state. Before this operation of the switch, the operation of the voltage follower will bring the voltage over the capacitor to be close to the voltage difference between the first and second voltages, so that the operation of the first switch will not severely change the voltage over the capacitor.

The voltages are provided to the terminals, while the second switch does not short-circuit the first resistor. It is noted that the first resistor allows or caters for a voltage difference between the voltage follower output and the capacitor.

Then, the second switch is brought to short-circuit the first resistor, whereby the voltage difference between the capacitor and the voltage follower may be removed or be reduced. This is an advantage when the first switch is operated from the first state to the second state, as the voltage difference over the capacitor in the two situations is very small, so that no large transients are caused by the capacitor due to the changed interconnections.

A fifth aspect of the invention relates to a method of operating a switchable filter according to the second aspect of the invention, the method comprising the steps of:

providing a second predetermined voltage to the signal path, and operating the first switch from the first state to the second state.

By providing the second predetermined voltage to the signal path, this voltage is provided on the first terminal of the switchable capacitor and thus often to the voltage follower, whereby a corresponding voltage is fed to the first resistor. Then, this will act to vary the voltage over the capacitor.

As described above, this will act to provide a voltage over the capacitor which is in the vicinity, depending on the component values of the first resistor and the capacitor, of the voltage on the signal path. Then, operation of the first switch may be performed with a not-too-high transient generation.

A final aspect of the invention relates to a method of operating the testing assembly according to the third aspect of the invention, the method comprising the steps of:

at least one source feeding a varying voltage to the device via a switchable filter, the monitoring device monitoring an output of the device, maintaining the voltage output of the at least one source at a predetermined level, and operating the first switch of the switchable filter into its second state.

Thus, the voltage output by the source is initially varying, which causes the above-described charging and discharging of the capacitor but which also causes the device to output a varying output. The monitoring device will receive the output of the device and potentially compare this output to a desired output.

Preferably, and the method comprises the step of, prior to the step of operating the first switch, operating the second switch to short circuit the second resistor. By operating the second switch, the resistance of the first resistor is removed (or reduced), whereby the voltage difference between the capacitor (the terminal connected to the first switch) and the voltage on the signal path will be reduced further, so that any transient generated by the switching of the first switch is even further reduced.

In general, the above methods may further comprise the step of, prior to the providing of the second predetermined voltage to the first terminal or the signal path, varying a voltage on the first terminal. Where this may seem trivial, this varying voltage will act to provide a varying voltage by the voltage follower and thus to the capacitor when the first switch is in the first state. Thus, the capacitor will be charged and recharged by this varying voltage, but in a manner, due to the voltage follower, where this charging and discharging will not affect the signal on the first terminal or in the signal path too much.

When the desired output is reached or when a testing procedure has ended, a predetermined signal for each input may be determined, and the source(s) controlled to deliver and maintain the pertaining signal. Then, the first switches may be operated to bring into operation the filters for each input, now filtering the signals fed by the sources.

The device may then be used for any other operation while being fed these predetermined signals and while the first switches are in the second states.

Clearly, before or at switching of the first switches, the above-mentioned second switches may, if provided, be used for short-circuiting the first resistor of each switchable filter.

BRIEF DESCRIPTION OF THE DRAWINGS

In the following, preferred embodiments of the invention will be described with reference to the drawing, wherein.

DETAILED DESCRIPTION OF VARIOUS EMBODIMENTS

Figure 1:
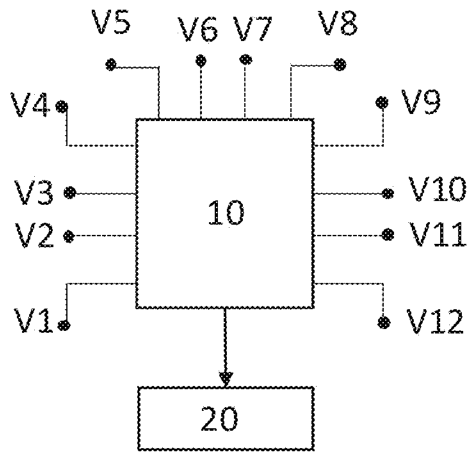
FIG. 1 illustrates a test regime of a device under test.

In FIG. 1, a device under test 10 is provided with a number, here 12, of voltages or signals in order to be tested, set up, tuned or calibrated. Often, the signals V1-V12 will be varied while an output or performance of the device 10 is monitored using a performance evaluation circuit 20. Once a suitable set of signals V1-V12 are determined for the device 10, these voltages may then be fixed and the device be used for another purpose, such as an intended purpose.

Figure 2:
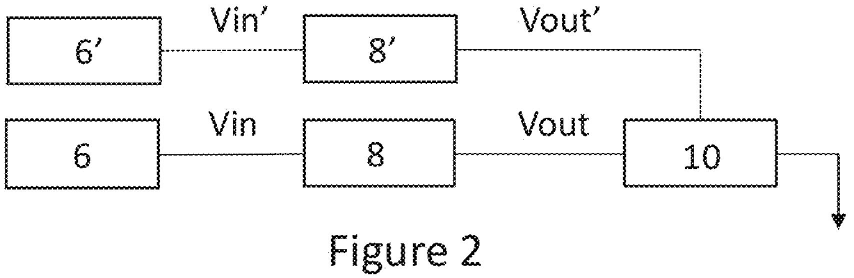
FIG. 2 illustrates the manner of generating a test signal.

For each voltage or signal, the voltage or signal is provided by (see FIG. 2) a voltage or signal source 6 (another source is indicated by 6') and fed through a switchable low-pass filter 8 (8', respectively) to the device 10. The source 6/6' will often be a source of high-frequency noise caused by active component usually present in the source 6/6'. The source 6/6' may also comprise a current sensor if desired. In usual operation of the device 10, this high-frequency noise is desired filtered so as to not affect the operation of the device.

Clearly, any swift variation, as described above, of a voltage will be affected by the low pass filter when provided in the signal path. Thus, it is desired that the filter can be coupled-in but also coupled-out. Then, the tuning may be performed with the filter coupled out, so that the voltage may be varied more swiftly.

Once the voltage is set as desired, the low pass filter is coupled in. On the other hand, the coupling-in or switchingin of the filter should be performed without excessive transients, as transients may destroy the tuning or state of the device 10.

Figure 3:
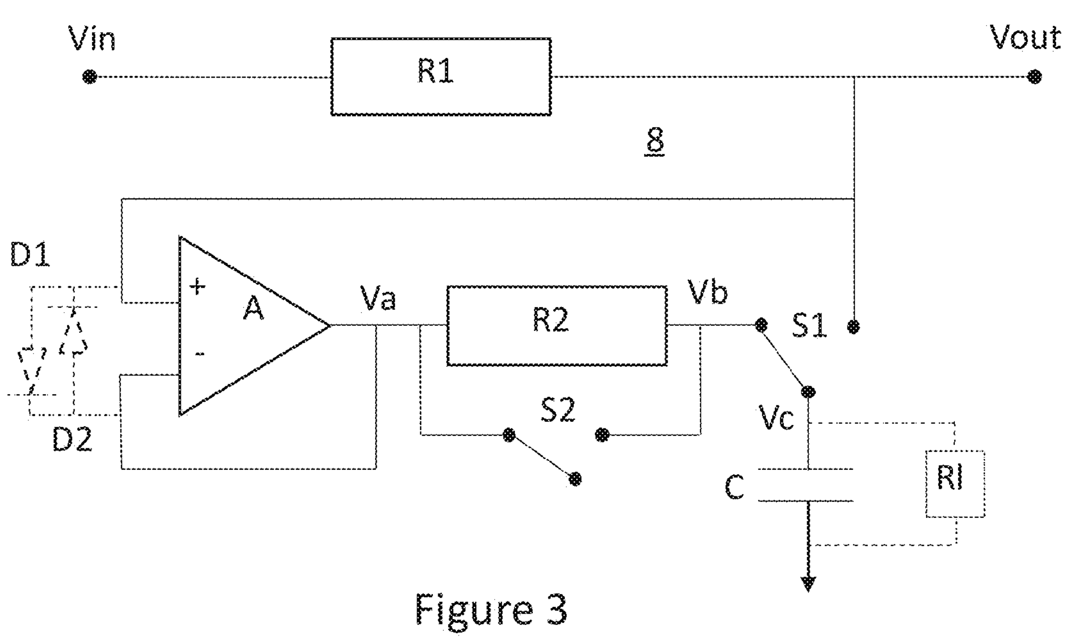
FIG. 3 illustrates a switchable capacitor and filter according to the invention.

In FIG. 3, a preferred circuit or filter 8 is illustrated in which a signal path is seen between Vin and Vout. A low pass filter is desired switched into this signal path without detrimental transients. The actual low pass filter 8 is formed by R1, provided in the signal path, and C, which may be provided between the signal path and ground.

A switch S1 is provided which is capable of connecting the capacitor to the signal path and thus couple-in the low pass filter in the signal path. The low pass filter is coupled-out when the switch S1 is in the position seen in FIG. 3.

In FIG. 3, a voltage follower, here in the shape of an operational amplifier A, is connected to the signal path. The operation of the voltage follower is to follow the voltage on the signal path.

The amplifier A preferably is a precision amplifier with a low bias current, a high amplification and a low offset.

The output of the voltage follower is provided to the capacitor C in order to charge the capacitor to the same voltage as seen in the signal path, here Vout. The operation of the voltage follower is to charge the capacitor C to the voltage Vout before flipping the switch S1.

The voltage follower thus will charge and discharge the capacitor as the voltage Vout and thus Va, varies.

A resistor, R2, is provided between the amplifier output and the capacitor C so as to allow a difference between the voltage, Vc, over the capacitor and the output voltage, Va, of the amplifier.

This allows the voltage Va to follow the voltage Vout even though the capacitor will charge and discharge with a time constant. Thus, when the voltage of the signal path varies swiftly, the voltage follower will perform its operation and follow that voltage, resulting in a corresponding charging and de-charging of the capacitor, but without obtaining a voltage difference between Vout and Va sufficient to exceed the threshold voltage of the parasitic diodes D1 and D2 of the amplifier. These diodes are indicated in hatched lines, as they exist within the amplifier.

When the voltage on the signal path is fixed or constant, the voltage Va of the voltage follower will match Vout and the voltage Vc will move toward Va and thus Vout. The time required for this will depend on the component values. It is desired that this takes no more than 5 seconds.

It is noted that the capacitor C will have a parasitic leak resistance, R1, indicated in hatched lines. Thus, as R1 and R2 will form a voltage divider, Vc will not completely reach Va, whereby a transient of some size will be seen when flipping the switch S1. The size of this transient and thus of the voltage Vc will depend on the relative sizes of $R^2$ and R1.

If C1 is 1 μF and $R^2$ is 10kΩ, the RC time constant of the charging is 10 ms so that Vc would be within 0.5V of Vout within 30 ms. However, with an R1 of 300MΩ typical for a high-quality 1 μF capacitor, the DC difference between Vout and Vc would be 333 μV when Vin is 10V. Thus, a transient of >333 μV would be seen when flipping S1. This high a transient would be unacceptable for many applications.

This transient may be reduced further, if the switch S2, which has a much lower resistance than R2, is flipped before the switch S1 is flipped. In that manner, Vc will reach Va and thus Vout within uV. Thus, S2 should be flipped before S1 so that Vc has time to reach Va. It is noted that when the voltage different, with S2 open, between Vc and Va/Vout is lower than the threshold voltage of the parasitic diodes D1/D2, the closing of S2 will not exceed that threshold voltage.

If A delivers 10 mA independently of the voltage difference on its inputs, the capacitor will be charged with a dvdt of 10 mA/10 μF=10 kV/s. in the case of the voltage difference being 0.5V, the capacitor would be fully charged in 50 μs. Then, the switch S1 may be flipped with hardly any transients.

The time required for the "final" charging of the capacitor clearly will depend on the component values and the initial voltage difference between Vc and Vout, but usually a time delay of 1 ms would suffice for Vc to reach Vout after flipping of S2.

The flipping of the switches S2 and S1 may even be controlled by the same signal if the switches are selected as different in type. A FET transistor-based switch is swifter in operation than a latched relay, so that when feeding the same flipping signal to S2 as a FET transistor, S2 will close in time before S1 being a latched relay would have time to react and switch. In that situation, a single signal may be used for controlling both switches when the desired voltage of Vin has been reached and has allowed to persist for a sufficient period of time for the voltage follower to charge the capacitor to the value defined by the relation between R2 and R1.

It is noteworthy that the main insight of this invention is that the typical parasitic leak resistance R1 and the typical parasitic diodes D1/D2 are making it necessary to add the switch S2 to the circuit and use the above mentioning switching timing, to achieve the lowest possible transient when switching S1. Without these parasitics, which unfortunately are present in the components used for most applications, the extra switch S2 would not be needed, and S1 could be switched without transients.

The invention claimed is:

1. A switchable capacitor assembly comprising:

a first terminal, a second terminal, a first resistor, a first switch, a capacitor operatively connected between the first switch and the second terminal, a voltage follower operatively connected between the first terminal and the first resistor, the first resistor being operatively connected between the voltage follower and the first switch, and a second switch configured to short circuit the first resistor, where the first switch is configured to toggle between two states comprising:

a first state where the switch operatively connects the capacitor to the first resistor and a second state where the switch operatively connects the capacitor to the first terminal.

2. The switchable capacitor assembly according to claim 1, wherein the voltage follower comprises an amplifier.

3. A switchable filter comprising:

a signal path having a signal input and a signal output, a second resistor operatively provided between the signal input and the signal output and the switchable capacitor assembly according to claim 1, where the first terminal is connected to the signal path and where the second terminal is connected to a first predetermined potential.

4. An assembly for testing a device, the assembly comprises:

a plurality of signal sources, a plurality of switchable filters according to claim 3, and a monitoring device configured to monitor the operation of the device, where:

the device has a plurality of inputs and an output, each switchable filter is operationally connected between a separate source and a separate input, the output is operationally connected to the monitoring device.

5. A method of switching the switching capacitor assembly according to claim 1, the method comprising the steps of:

a) connecting the second terminal to a first predetermined potential, b) providing a second predetermined voltage to the first terminal while the second switch does not short circuit the first resistor, c) operating, after step b), the second switch to short circuit the first resistor and d) operating the first switch from the first state to the second state.

6. The method according to claim 5, wherein the switchable capacitor assembly forms part of a switchable filter also comprising:

a signal path having a signal input and a signal output, a second resistor operatively provided between the signal input and the signal output where the first terminal of the switchable capacitor assembly is connected to the signal path and where the second terminal is connected to a first predetermined potential, the method comprising the steps of:

providing a second predetermined voltage to the signal path, and operating the first switch from the first state to the second state.

7. The method of operating according to claim 6, where a plurality of the switchable filters form part of an assembly for testing a device, the assembly comprising:

a plurality of signal sources, and a monitoring device configured to monitor the operation of the device, where:

the device has more a plurality of inputs and an output, each switchable filter is operationally connected between a separate source and a separate input, and the output is operationally connected to the monitoring device, the method comprising the steps of:

at least one source feeding a varying voltage to the device via a switchable filter, the monitoring device monitoring an output of the device, maintaining the voltage output of the at least one source at a predetermined level, and operating the first switch of the switchable filter into its second state.

8. The method according to claim 6, further comprising the step of, prior to the step of operating the first switch, operating the second switch to short circuit the second resistor.

9. The method according to claim 6, further comprising the step of, prior to the providing of the second predetermined voltage to the first terminal or the signal path, varying a voltage on the first terminal.

* * * * *